United States Patent [19]
Kwong

[11] Patent Number: 6,115,290
[45] Date of Patent: Sep. 5, 2000

[54] MECHANISM FOR RESETTING SENSE CIRCUITRY TO A KNOWN STATE IN A NONVOLATILE MEMORY DEVICE

[75] Inventor: Phillip M. L. Kwong, Folsom, Calif.

[73] Assignee: Intel Corporation, Santa Clara, Calif.

[21] Appl. No.: 09/069,422

[22] Filed: Apr. 29, 1998

[51] Int. Cl.$^7$ .................................................. G11C 16/06
[52] U.S. Cl. .............................. 365/185.25; 365/185.21; 365/233.5
[58] Field of Search ........................... 365/185.25, 185.2, 365/233.5, 185.21, 185.01, 230.01

[56] References Cited

U.S. PATENT DOCUMENTS

| | | | |
|---|---|---|---|
| 4,884,241 | 11/1989 | Tanaka et al. ........................... | 365/210 |
| 4,933,906 | 6/1990 | Terada et al. ............................ | 365/208 |
| 5,243,575 | 9/1993 | Sambandan et al. . | |
| 5,423,047 | 6/1995 | Leak . | |
| 5,497,354 | 3/1996 | Sweha et al. ....................... | 365/230.06 |
| 5,539,690 | 7/1996 | Talreja et al. ....................... | 365/185.22 |
| 5,563,843 | 10/1996 | Fackenthal et al. . | |
| 5,592,435 | 1/1997 | Mills et al. . | |
| 5,594,691 | 1/1997 | Bashir ................................ | 365/189.09 |
| 5,798,967 | 8/1998 | Sarin et al. ......................... | 365/185.21 |
| 5,805,500 | 9/1998 | Campardo et al. .................. | 365/185.2 |
| 5,805,517 | 9/1998 | Pon . | |

FOREIGN PATENT DOCUMENTS

9506230  5/1995  WIPO .

*Primary Examiner*—David Nelms
*Assistant Examiner*—Hoai V. Ho
*Attorney, Agent, or Firm*—Blakely, Sokoloff, Taylor & Zafman LLP

[57] ABSTRACT

A memory device including a nonvolatile memory cell, a bit line coupled to the nonvolatile memory cell, and circuitry coupled to the nonvolatile memory cell and the bit line. The circuitry is configured to reset the bit line to a predetermined state for an amount of time in response to a transition of an input address signal.

13 Claims, 7 Drawing Sheets

MECHANISM FOR RESETTING SENSE CIRCUITRY TO A KNOWN STATE IN A NONVOLATILE MEMORY DEVICE

FIELD OF THE INVENTION

The present invention relates to the sensing the state of nonvolatile memory cells. More particularly, the present invention relates to sensing the state of flash memory cells.

BACKGROUND

Nonvolatile memory devices such as Electrically programmable Read Only Memories ("EPROMs"), Electrically Erasable Programmable Read Only Memories ("EEPROMs"), and flash EEPROMs include an array of nonvolatile memory cells and supporting circuitry for accessing the array. A nonvolatile memory cell typically behaves like a field effect transistor and includes a select or control gate that controls the reading and writing of data to the memory cell and a floating gate that traps charge corresponding to data stored by the memory cell.

An attractive feature of nonvolatile semiconductor memories is their ability to store analog data. This permits storage of multiple bits of data in a single memory cell. As charge is added to the floating gate of a memory cell, the threshold voltage Vt of the memory cell increases, and the memory cell drain current ID ("cell current") decreases. The memory cell threshold voltage Vt is related to the memory cell drain current ID such that ID is proportional to:

$$Gm \times (VG-Vt) \text{ for } VD>VG-Vt$$

where Gm is the transconductance of the memory cell; VG is the memory cell gate voltage; VD is the memory cell drain voltage; and Vt is the memory cell threshold voltage.

For memory cells storing multiple bits of data, each of the possible patterns of bits represents one state. In effect, the cell is storing base S data, where S is the number of states the cell is capable of storing. The bit pattern results from decoding the state data of one or multiple cells. For example, for memory cells storing two bits of data there are four bit patterns: 00, 01, 10, and 11. Each of these bit patterns is represented by a state. The particular state represented by a particular pattern of bits depends upon the type of coding used (e.g., Gray coding or binary). The type of coding generally does not effect the method of programming.

States may be defined in a variety of ways. They may be defined in terms of a range of threshold voltages Vt, a range of drain currents ID, or a range of charge. To distinguish between possible states, the states are separated by separation ranges. When a flash cell is read, the current conducted, or voltage generated, by the addressed flash cell is compared against a reference current conducted, or reference voltage generated, by a reference flash cell. The reference flash cell has a reference threshold voltage, reference drain current, or reference amount of charge in the separation range between the states such that a comparator such as a sense amplifier can determine the state of the selected flash cell.

Figure 1:
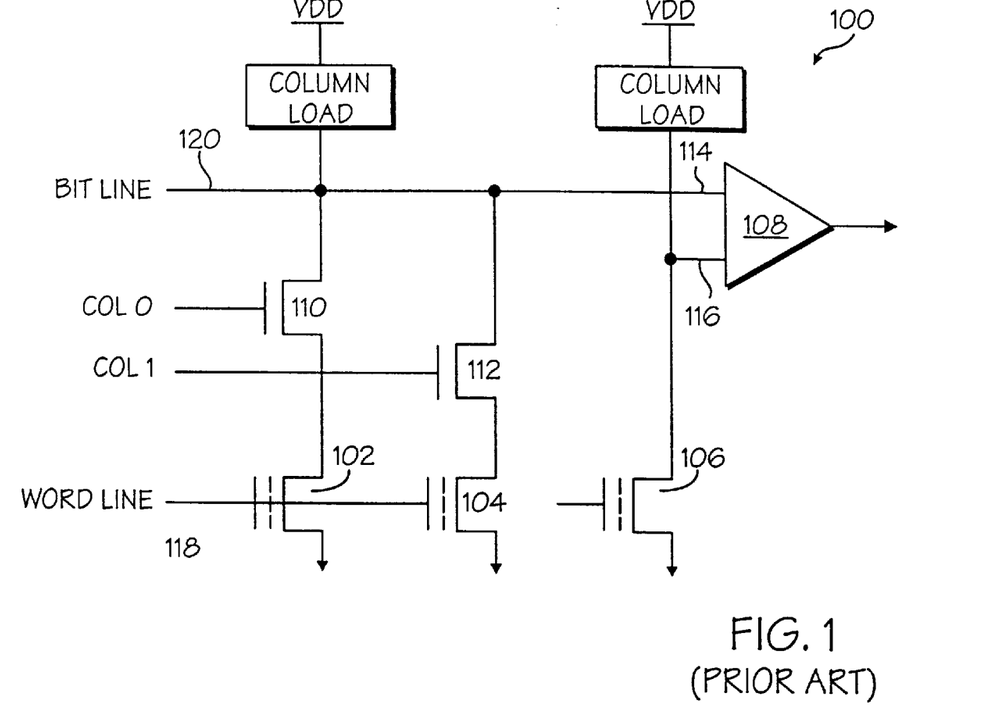
FIG. 1 is a conventional flash memory device including a sense amplifier and a reference flash memory cell.

FIG. 1 shows a conventional memory device 100 including flash memory cells 102 and 104 that are two flash cells in a flash memory array. Each flash cell includes a select or control gate coupled to word line 118, a floating gate for storing data or charge, a drain terminal coupled to transistor 110 or 112, and a source terminal coupled to ground. Flash cells 102 and 104 are uniquely addressable such that when an address is supplied to circuit 100, row and column decoding logic select flash cell 102 or 104 by applying the appropriate voltages to word line 118 and column lines COL0 and COL1.

When one of the flash cells is selected for reading, a biasing voltage is applied to word line 118. The same biasing voltage is also supplied to the select gate of reference flash cell 106. The amount of current flowing through the selected flash cell causes a voltage to develop on bit line 120. This voltage is provided to input 114 of sense amplifier 108. The voltage on input 114 may be compared with the voltage developed on input 116 by the current flowing through flash reference cell 106. The speed at which the voltages can be developed at the inputs of sense amplifier 108 has a direct impact on the overall read access time for memory device 100.

Figure 2:
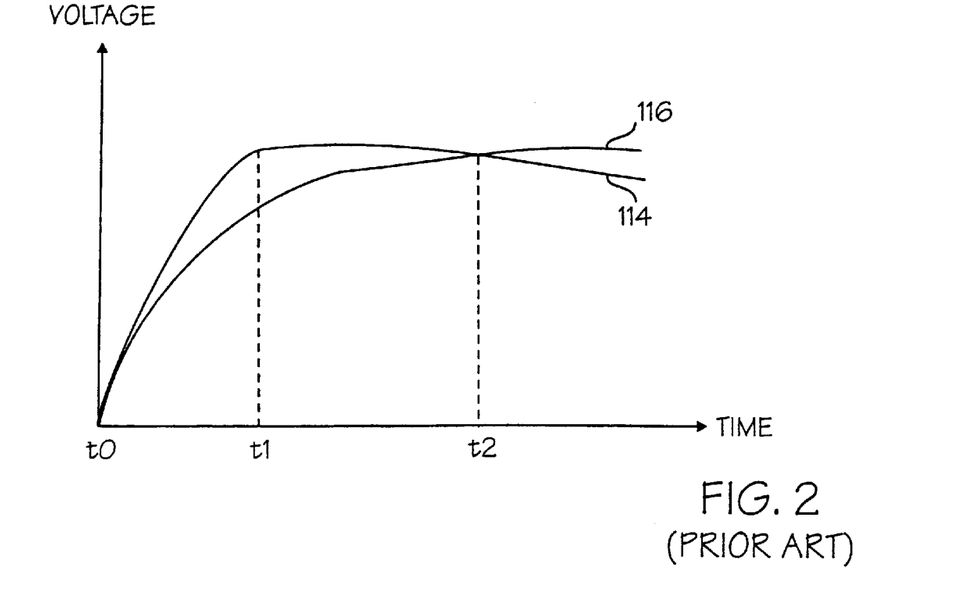
FIG. 2 is a qualitative graph of the voltages supplied to the sense amplifier of FIG. 1 after addressing flash memory cells having different states.

FIG. 2 shows voltages supplied to inputs 114 and 116 as a function of time when flash memory cells 102 and 104 store different states and are consecutively addressed. In this example, flash cell 102 has a lower threshold voltage than flash cell 104, and reference cell 106 has a threshold voltage in a separation range between the threshold voltages of flash cells 102 and 104. At time t0, flash cell 102 is selected by COL0 and word line 118. As flash cell 102 has a lower threshold voltage than reference cell 106, the voltage on bit line 120 and input 114 will rise to a voltage greater than input 116 at time t1. When flash cell 104 is subsequently addressed by COL1 and word line 118, flash cell 104 discharges bit line 120 and input 114 to voltage level below input 116 (e.g., at time t2). It generally requires a longer time for flash cell 104 to discharge bit line 120 from time t1 to t2, than for flash cell 102 to charge bit line 120 because of the reduced amount of current drive supplied by flash cell 104 relative to the resistance of the column load circuits. Thus, the read access time for memory device 100 may be pushed out when switching between flash cells 102 and 104.

Figure 3:
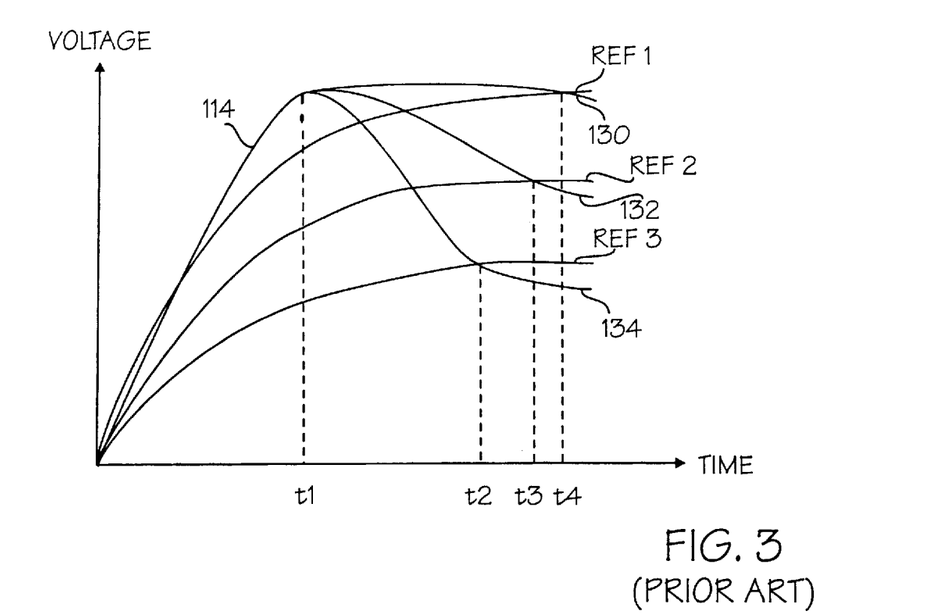
FIG. 3 is a qualitative graph of the voltages supplied to the sense amplifier of FIG. 1 after addressing multi-level flash memory cells having different states.

The problem highlighted in FIG. 2 may be more acute in multi-level flash cell devices. For example, FIG. 3 shows voltages supplied to inputs 114 and 116 when flash memory cells 102 and 104 store one of four different states (i.e., two bits of data) and are consecutively addressed. In this example, flash cell 102 stores the lowest threshold voltage and flash cell 104 may store one of three higher threshold voltages corresponding to curves 130, 132, and 134. Reference cell 106 would typically be replaced by three reference cells each having a threshold voltage in separation ranges between the four states that can be stored by flash cells 102 and 104, and each resulting in voltage curves REF1, REF2, and REF3 at the input(s) of one or more sense amplifiers. As shown in FIG. 3, the higher the threshold voltage of flash cell 104, the longer it generally requires for flash cell 104 to discharge bit line 120. Thus, the read access time may be at its worst case condition when flash cell 102 stores a state corresponding to the lowest threshold voltage and flash cell 104 stores a state corresponding to a higher threshold voltage just below REF1 (i.e., curve 130).

The read access time may be further increased by the physical location of flash cells 102 and 104 within the flash memory array relative to sense amplifier 108. For example, assume that flash cells 102 and 104 are physically located at opposite ends of a long flash memory array having word line 118 and bit line 120 running substantially the entire length of the array, and sense amplifier 108 located at the end of the array nearest flash cell 104. If flash cell 102 has a lower threshold voltage than reference cell 106, then it generally requires a relatively long amount of time for the load on flash cell 102 to charge input 114 to a voltage above the voltage on input 116 because of the resistance and capacitance of bit line 120. This is generally referred to a long "bit line turn on time." This will generally push out the read access time. Additionally, when flash cell 104 is addressed, it generally takes a long time for the voltage on word line 118 to traverse the memory array and select flash cell 104. Thus flash cell 104 may have a long "word line turn on time" which generally pushes out the read access time. If, as shown in FIG. 2, flash cell 102 had a lower threshold voltage than flash cell 104, then addressing flash cell 104 after addressing flash cell 102 would also push out the read access time because it would take a relatively long amount of time for flash cell 102 to discharge the entire length of bit line 120.

Figure 4:
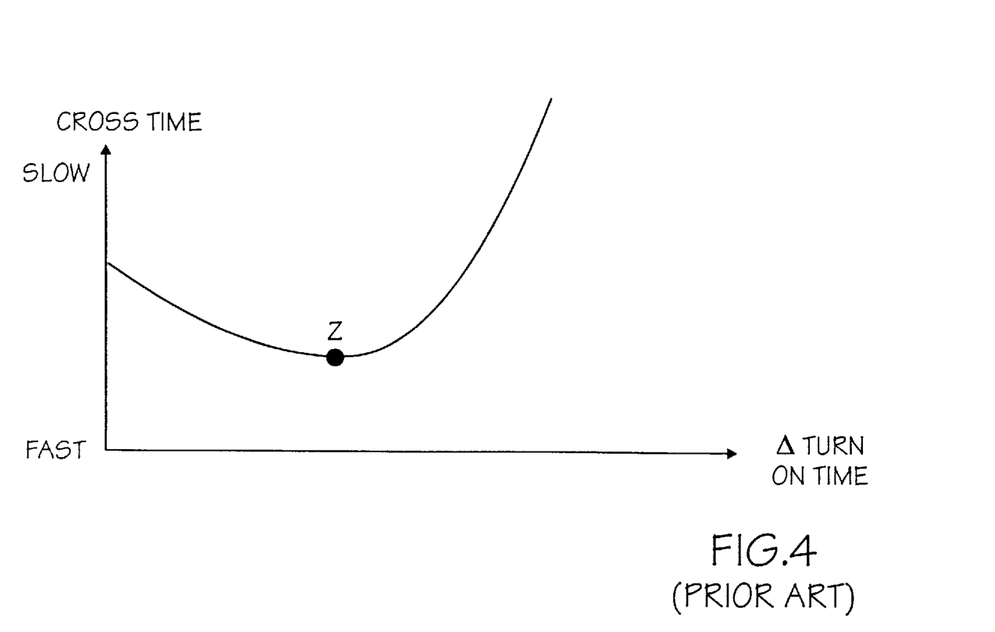
FIG. 4 is a qualitative graph of the time required for the voltages to cross on the input lines to the sense amplifier vs. the difference in the turn on times of the word lines and bit lines of FIG. 1.

The relationship of bit line turn on time, word line turn on time, and the voltages developed at inputs 114 and 116 of sense amplifier 108 is generally shown in the graph of FIG. 4. The Y axis is labeled as "Cross Time" and refers to the amount of time in FIG. 2, for example, that is required for flash cell 104 to discharge bit line 120 to a point where the voltage at input 114 crosses the voltage on input 116 (i.e., at time t2 of FIG. 2). The X axis is label "Δ Turn On Time" and refers to the difference in the word line turn on time and the bit line turn on time (i.e., word line turn on time minus bit line turn on time). As shown in FIG. 4, there is a point Z at which the Δ turn on time yields the fastest cross time, that is, at point at which the memory device has the fastest read access path when switching addressed flash cells that store different states. It is generally desirable to have memory device 100 operate near point Z to achieve the fastest read access time.

One previous technique used to reduce the read access time caused by switching between flash cells storing different states has been to electrically connect inputs 114 and 116 together for a period of time while charging or discharging bit line 120. However, this technique generally requires complex circuitry to control the timing of the electrical connection and requires a large amount of silicon area to implement the circuitry. This technique has also been shown to cause the input voltage to react unpredictably when the electrical connection is disconnected. In flash memory devices using multi-level cell technology, it is not obvious to which flash reference cell an addressed flash cell should be electrically connected to during the charging or discharging time. Selection of the incorrect reference cell could further increase, rather than reduce, the read access time.

SUMMARY OF THE INVENTION

A memory device is disclosed. The memory device includes a nonvolatile memory cell, a bit line coupled to the nonvolatile memory cell, and circuitry coupled to the nonvolatile memory cell and the bit line. The circuitry is configured to reset the bit line to a predetermined state for an amount of time in response to a transition of an input address signal.

Other features and advantages of the present invention will be apparent from the accompanying drawings and from the detailed description that follows.

BRIEF DESCRIPTION OF THE DRAWINGS

The features and advantages of the present invention are illustrated by way of example and not limitation in the figures of the accompanying drawings in which like references indicate similar elements and in which.

DETAILED DESCRIPTION

A memory device is disclosed. For one embodiment, the memory device includes a nonvolatile memory cell having a floating gate for storing data, a bit line coupled to the nonvolatile memory cell, and circuitry coupled to the nonvolatile memory cell and the bit line. The circuitry is configured to reset the bit line to a predetermined state for an amount of time in response to a transition of an input address signal. The memory device further includes sensing circuitry coupled to the bit line and configured to sense the data stored by the nonvolatile memory cell after the amount of time.

An intended advantage of the embodiments of the memory device described below is to reduce the read access time of the memory device. The embodiments described below are particularly useful when consecutively addressing flash memory cells having different threshold voltages.

Figure 5:
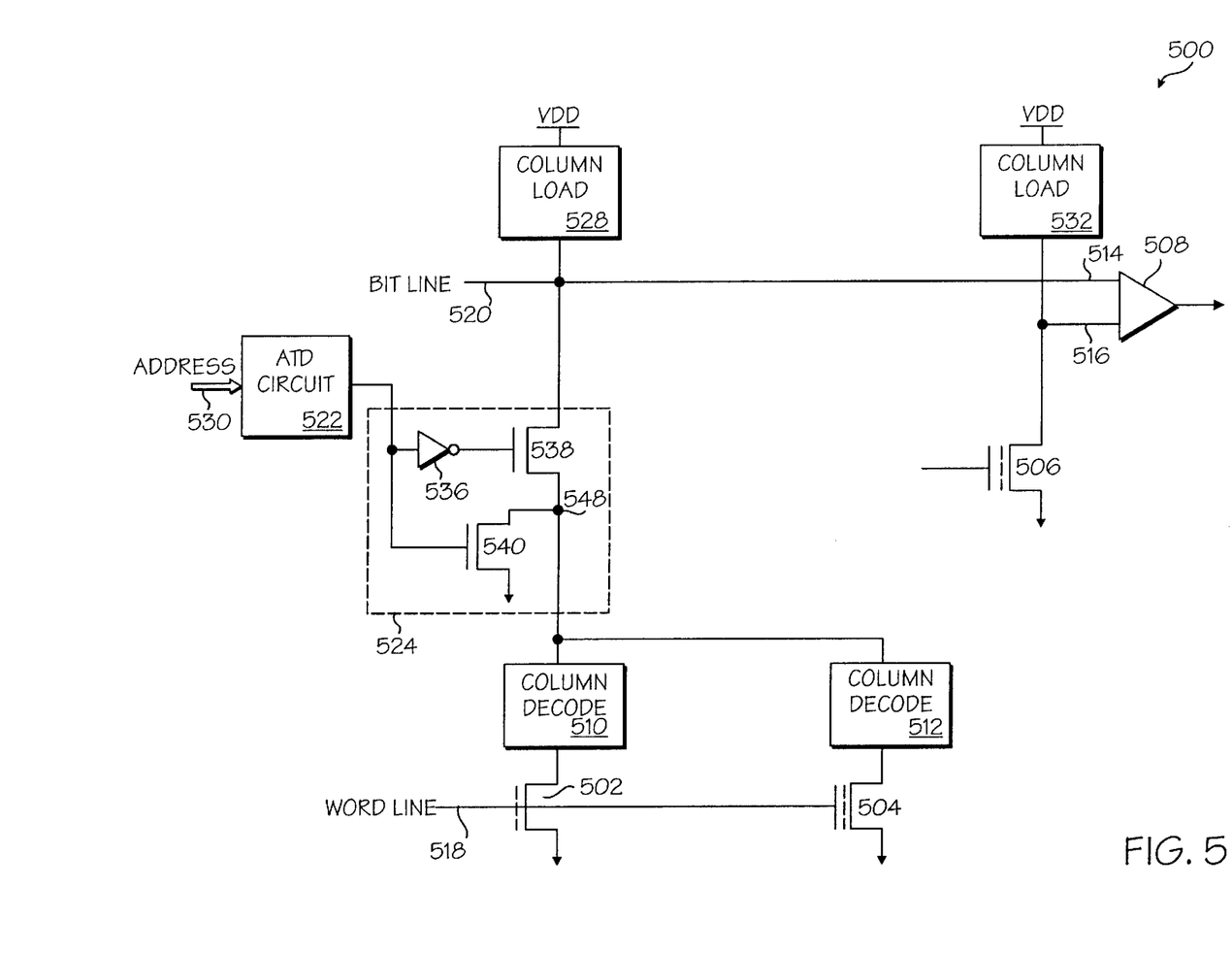
FIG. 5 is a block diagram of one embodiment of a flash memory device including an address transition detection (ATD) circuit, reset circuitry, and sensing circuitry.

FIG. 5 shows in block diagram form nonvolatile memory device 500. Memory device 500 includes flash memory cells 502 and 504 that may be any two flash memory cells located in a flash memory array. While flash cells 502 and 504 are hereafter referred to as flash cells, flash cells 502 and 504 may be replaced, in alternative embodiments, by other nonvolatile memory cells (e.g., EEPROM cells, EPROM cells, and the like). For yet another embodiment, flash cells 502 and 504 may be replaced by volatile memory cells including dynamic random access memory (DRAM) cells that may store multiple states of information.

Flash cells 502 and 504 each have a select or control gate coupled to word line 518, a drain terminal coupled to column decode circuits 510 and 512, respectively, and a source terminal coupled to ground. For alternative embodiments, the source terminals are coupled to each other and a common power supply that may produce different voltage levels during program, read, or erase operations. Flash cells 502 and 504 each also include a floating gate for storing charge or data. Each flash cell 502 and 504 may store two or more logic states as, for example, in a multi-level flash cell (MLC).

Flash memory cell 502 is coupled to bit line 520 by column decode circuit 510 and reset circuit 524. Similarly, flash memory cell 512 is coupled to bit line 520 by reset circuit 524 and column decode circuit 512. For another embodiment, a second reset circuit configured in the same manner as reset circuit 524 may be coupled between column decoder 512 and bit line 520.

Bit line 520 is coupled to column load 528 that may be any generally known column load circuit. For one embodiment, column load 528 is a p-channel transistor configured as a diode. Column decode circuits 510 and 512 include any column decode circuitry generally known. For one embodiment, column decode circuit 510 includes an n-channel transistor having its drain coupled to node 548, its source coupled to the drain of clash cell 502, and its gate coupled to a column address line. Similarly, column decode circuit 512 may include an n-channel transistor having its drain coupled to node 550, its source coupled to the drain of clash cell 504, and its gate coupled to another column address line.

Memory device 500 also includes flash reference memory cell 506. Reference cell 506 may be included within the flash array of flash cells 502 and 504, or it may located in a different memory array. Reference cell 506 also has its source coupled to ground, and its drain coupled to an input 516 of sense amplifier 508. The input 516 is also coupled to column load 532 that may be any generally known column load circuit. For one embodiment, column load 532 is a p-channel transistor configured as a diode. Reference flash cell 506 receives the same biasing voltage on its select or control gate as flash cells 502 and 504 during a read operation. For one embodiment, a reset circuit configured in the same manner as reset circuit 524 may be coupled between the drain of reference cell 506 and input 516.

Reference cell 506 has a reference threshold voltage, reference drain current, or reference amount of charge corresponding to a separation range between the states (i.e., threshold voltages, current, or charges) stored by flash cells 502 and 504 such that a sense amplifier 508 can determine the state of the selected flash cell.

Alternatively, reference cell 506 may be replaced by more than one reference cell in a MLC design. Each reference cell may store a reference amount of charge that corresponds to a separation range between states stored by cells 502 and 504. A selector circuit or other circuitry may be included to select between the different reference cells. Other examples of circuitry for determining the data stored in MLC flash cells 502 and 504 are disclosed in published PCT application PCT/US95/06230 having international publication No. WO 95/23074 published on Dec. 14, 1995, and entitled SENSING SCHEMES FOR FLASH MEMORY WITH MULTI-LEVEL CELLS; U.S. Pat. No. 5,539,690 entitled WRITE VERIFY SCHEMES FOR FLASH MEMORY WITH MULTILEVEL CELLS; and U.S. Pat. No. 5,497,354 entitled BIT MAP ADDRESSING SCHEMES FOR FLASH MEMORY.

Reset circuit 524 is configured to reset node 548 to approximately zero volts in response to a positive pulse signal received from address transition detection (ATD) circuit 522. ATD circuit 522 provides a pulse signal on line 534 when ATD circuit 522 detects a change in one or more address lines on address bus 530. ATD circuit 522 may be any ATD circuit that can detect an address transition and generate a pulse signal on line 534.

Reset circuit 524 includes inverter 536 and n-channel transistors 538 and 540. Transistor 538 has its drain coupled to bit line 520, its gate coupled to ATD circuit 522 via inverter 536, and its source coupled to column decode 510 at node 548. Transistor 540 has its drain coupled to node 548, its source coupled to ground, and its gate coupled to ATD circuit 522.

For an alternative embodiment, transistor 538 may be replaced with a p-channel transistor and inverter 536 may be omitted. For yet another embodiment, inverter 536 and transistor 538 may be omitted.

When ATD circuit 522 generates a positive pulse signal on line 534, inverter 536 turns off transistor 538 such that node 548 is decoupled from bit line 520. During the pulse time, transistor 540 discharges node 548 to approximately zero volts. For alternative embodiments, node 548 may be pulled to another voltage besides ground. When the pulse signal is terminated, transistor 538 couples node 548 to bit line 520. Thus, during the ATD pulse on line 534, node 548 is discharged or reset to a predetermined voltage or state. By setting node 548 to a predetermined voltage or state, the read access time of memory device 500 can be improved.

Figure 6:
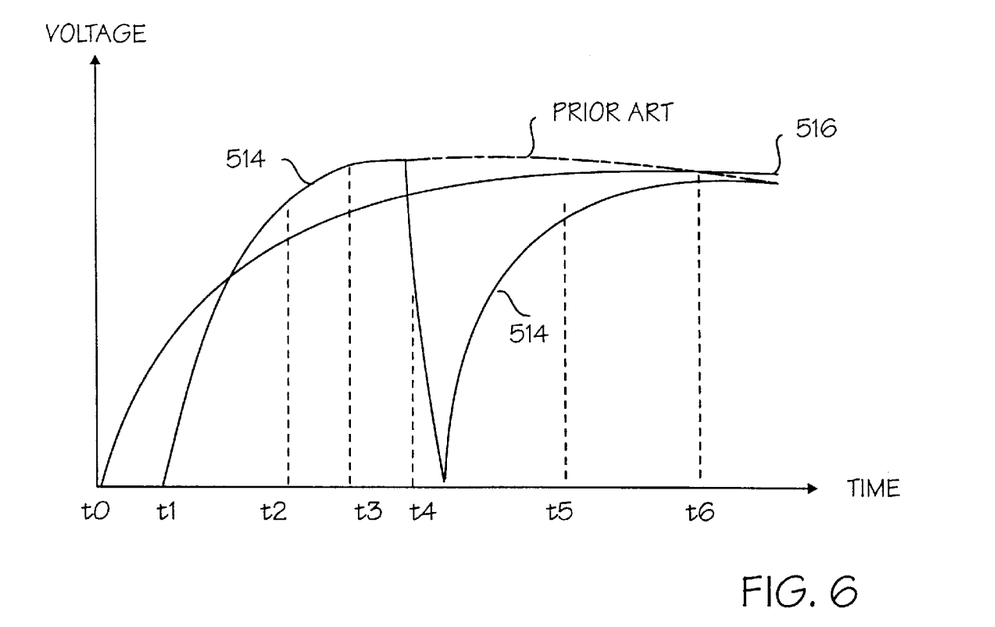
FIG. 6 is a qualitative graph of the voltages supplied to the sense amplifier of FIG. 5 by consecutively sensed flash memory cells storing different states.

FIG. 6 shows the qualitative response characteristics of the voltages provided to inputs 514 and 516 as a function of time when flash cells 502 and 504 store different states and are consecutively addressed. In this example, flash cell 502 has a lower threshold voltage than flash cell 504, and reference cell 506 has a threshold voltage in a separation range between the threshold voltages of flash cells 502 and 504. At time t0, flash cell 502 is addressed or selected by word line 518 and column decode 510 in response to an address on address bus 530. The changing of the address signals on address bus 530 causes ATD circuit 522 to generate a pulse signal on line 534 from time t0 to time t1. During this time, transistor 538 is off decoupling bit line 520 and input 514 from node 548 and flash cell 502, and transistor 540 pulls node 548 to approximately ground or zero volts. Also during this time, column decode circuit 510 is enabled to couple the drain of flash cell 502 to node 548, and word line 518 is set to an appropriate read bias voltage (e.g., approximately one to seven volts). The select gate of reference cell 506 is also set to the read bias voltage and input 516 starts to charge to the reference voltage.

At time t1, the pulse signal on line 534 is terminated (i.e., line 534 returns to a low logic state), and transistor 538 couples bit line 520 to the drain of flash cell 502 via column decode circuit 510. The low threshold voltage of flash cell 502 will cause bit line 520 and input 514 to charge to a voltage level greater than that supplied to input 516 by reference cell 506. Sense amplifier 508 may then sense the voltages at inputs 514 and 516 at, for example, time t2.

At time t3, the address signals on address bus 530 are changed to address or select flash cell 504. In response to the new address, ATD circuit 522 generates another pulse on line 534 from time t3 to time t4 that causes transistor 540 to discharge node 548 to ground. During this time, bit line 520 is decoupled from node 548 and is pulled towards VDD by column load 528. For an alternative embodiment, bit line 520 may be pulled to ground during this time. At time t4, the pulse signal on line 534 is terminated, and addressed flash cell 504 is coupled to bit line 520 via column decoder 512 and transistor 538. As shown in FIG. 6, the voltage on input 514 will drop towards ground when the pulse terminates at time t4, and then will charge to a voltage level determined by the high threshold voltage of flash cell 504. At time t5, sense amplifier 508 may then determine the state stored by flash cell 504.

Reset circuit 524 is particularly useful in the situation illustrated in FIG. 6, because it helps discharge bit line 520 and input 514 below the response characteristic of input 516 such that sense amplifier 508 can more rapidly sense the correct state stored in flash cell 504. This will generally improve the overall read access time of memory device 500 over 100 of FIG. 1. Discharging node 548 quickly below the voltage on line 516 is advantageous because node 548 is generally a high capacitive nodes that generally is coupled to hundreds or thousands of flash cells in a one or more columns. A typical conventional response curve for input 514 without reset circuit 524 is also shown in FIG. 6. As the graph illustrates, it may require a significantly longer amount of time for flash cell 504 to discharge input 514 without the aid of reset circuit 524 (i.e., until time t6). For one embodiment, the overall read access time with reset circuit 524 may be improved from approximately 15 to 40% over conventional devices such as those shown in FIG. 1.

As shown in FIGS. 5 and 6, the pulse signal generated by ATD circuit 522 decouples flash cells 502 and 504 from bit line 520 for an amount of time approximately equal to time that the pulse is provided on line 534. This will increase or push out the bit line turn on time for a given flash cell by an amount of time approximately equal to the pulse width of the pulse signal. Increasing the bit line turn on time causes a decrease in the Δ turn on time for a given word line turn on time. This may be advantageous as it may further help to reduce the read access time for memory device 500.

Figure 7:
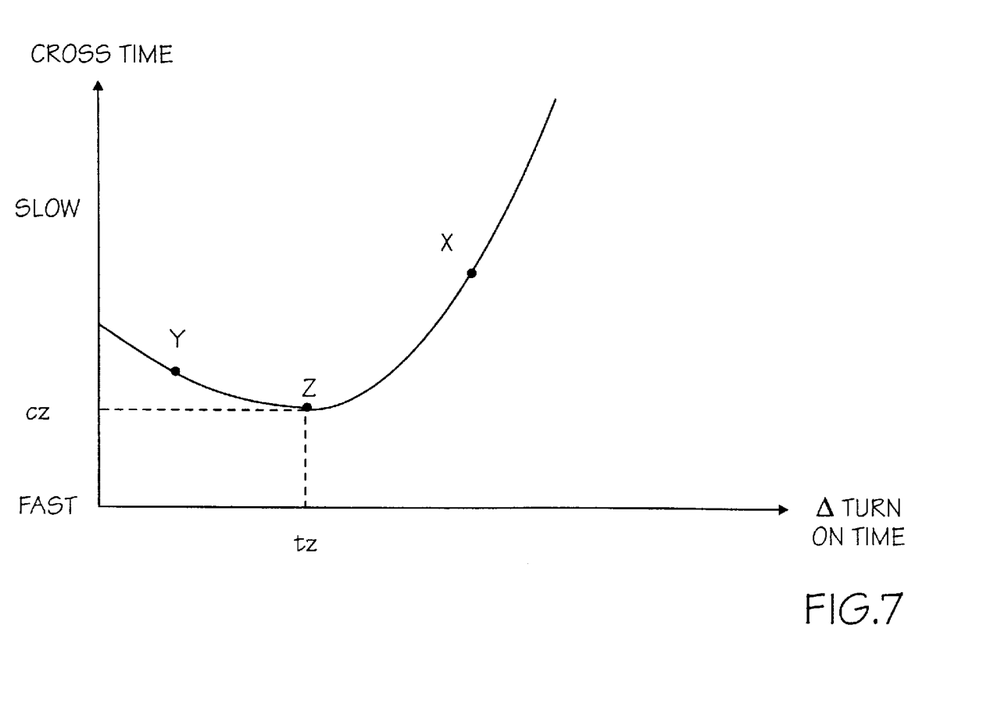
FIG. 7 is a qualitative graph of the time required for the voltages to cross on the input lines to the sense amplifier vs. the difference in the turn on times of the word lines and bit lines of FIG. 5.

FIG. 7 shows Cross Time vs. Δ Turn On Time for memory device 500. Memory device 500 has an optimum operating condition at point Z in which Δ turn on time tZ results in the fastest cross time CZ. If, for example, memory device 500 were to operate at point X under certain process, voltage, and temperature conditions, then the pulse width of the pulse signal generated by ATD circuit 522 could be increased to cause a corresponding decrease in Δ turn on time and move the operating point of memory device 500 closer to point Z. Similarly, if memory device 500 were to operate at point Y under certain process, voltage, and temperature conditions, then the pulse width of the pulse signal generated by ATD circuit 522 could be decreased to cause a corresponding increase in Δ turn on time and move the operating point of memory device 500 closer to point Z. In this manner, the pulse width of the pulse signal generated by ATD circuit 522 can be used to improve the read access time of memory device 500.

For alternative embodiments, ATD circuit 522 may include circuitry for tracking process, operating voltage, or temperature conditions to continually adjust the pulse width of the pulse signal on line 534 to help maintain the Δ turn on time near point Z.

The pulse width of the signal output by ATD circuit 522 can be set to correspond to the average optimum operating time Z for each column of flash cells based on their physical locations in the flash array. Alternatively, it can be set to compensate for the worst case operating condition. For yet another embodiment, the pulse width of the pulse signal can be modulated to be different amounts based on the location of the addressed flash cell in the flash array.

Figure 11:
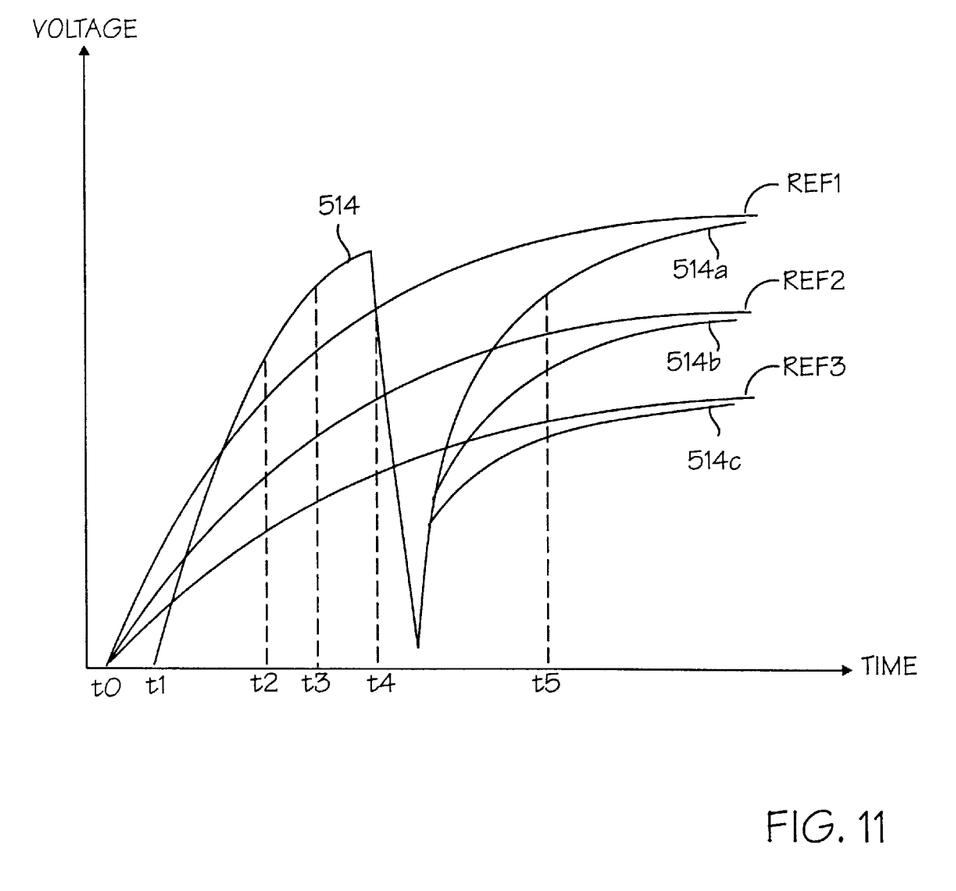
FIG. 11 is a qualitative graph of the voltages supplied to the sense amplifier of FIG. 5 after addressing multi-level flash memory cells having different states.

The use of ATD circuit 522 and reset circuit 524 is particularly useful when flash cells 502 and 504 are MLC cells that store more than two states of data (i.e., two or more bits of data). For example, FIG. 11 shows voltages supplied to inputs 514 and 516 when flash memory cells 502 and 504 store one of four different states (i.e., two bits of data) and are consecutively addressed. In this example, flash cell 502 stores the lowest threshold voltage and flash cell 504 may store one of three higher threshold voltages corresponding to curves 514a, 514b, and 514c. Reference cell 506 would typically be replaced by three reference cells each having a threshold voltage in separation ranges between the four states that can be stored by flash cells 502 and 504, and each resulting in voltage curves REF1, REF2, and REF3 at the input(s) of one or more sense amplifiers 508.

As shown in FIG. 11, from time t0 to time t1, ATD circuit 522 outputs a pulse signal on line 534 in response to detecting a change in the address signals on bus 530. At time t1, the pulse signal on line 534 is terminated (i.e., line 534 returns to a low logic state), and transistor 538 couples bit line 520 to the drain of flash cell 502 via column decode circuit 510. The low threshold voltage of flash cell 502 will cause bit line 520 and input 514 to charge to a voltage level greater than that supplied to input 516 by reference cell 506. Sense amplifier 508 may then sense the voltages at inputs 514 and 516 at, for example, time t2. At time t3, the address signals on address bus 530 are changed to address or select flash cell 504. In response to the new address, ATD circuit 522 generates another pulse on line 534 from time t3 to time t4 that causes transistor 540 to discharge node 548 to ground. During this time, bit line 520 is decoupled from node 548 and is pulled towards VDD by column load 528. For an alternative embodiment, bit line 520 may be pulled to ground during this time. At time t4, the pulse signal on line 534 is terminated, and addressed flash cell 504 is coupled to bit line 520 via column decoder 512 and transistor 544. As shown in FIG. 11, the voltage on input 514 will drop towards ground when the pulse terminates at time t4, and then will charge to a voltage level determined by the high threshold voltage of flash cell 504. At time t5, sense amplifier 508 may then determine the state stored by flash cell 504. Because node 548 (and bit line 520) were preset by reset circuit 524, bit line 520 and input 514 can be charged to the appropriate voltage level faster than if bit line 520 had to be discharged from the voltage at time t4 by flash cell 504 alone.

Figure 8:
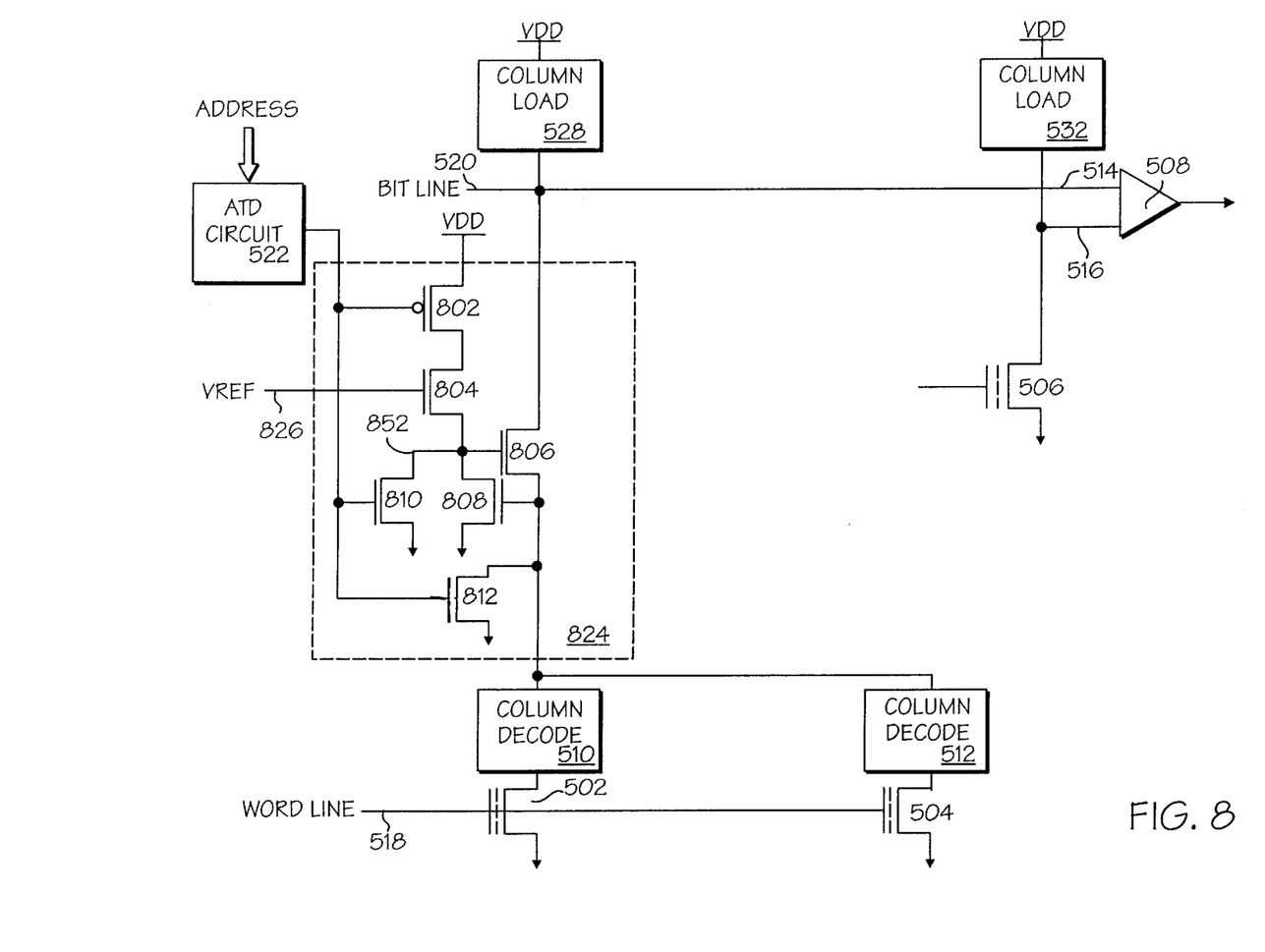
FIG. 8 is a block diagram of another embodiment of a flash memory device including an address transition detection (ATD) circuit, reset circuitry, and sensing circuitry.

FIG. 8 is another embodiment of memory device 500 having an alternative reset circuit 824. Reset circuit 824 is an amplifier circuit that resets node 848 to approximately zero volts or ground in response to a pulse signal from ATD circuit 522. Reset circuit 824 includes p-channel transistor 802 and n-channel transistors 804, 806, 808, 810, and 812. Transistor 802 has its source coupled to a power supply VDD, its gate coupled to line 534, and its drain coupled to the drain of transistor 804. Transistor 804 has its source coupled to node 852, and its gate coupled to a reference voltage VREF on line 826. VREF may be set to any voltage to generate a desired voltage at node 848. For one embodiments, VREF is approximately two to four volts. Node 848 will have a voltage of approximately VREF less a threshold voltage of each of transistors 804 and 806 when flash cell 502 is not addressed. Transistor 810 has its drain coupled to node 852, its gate coupled to line 534, and its source coupled to ground. Transistor 808 has its drain coupled to node 852, its gate coupled to node 848, and its source coupled to ground. Transistor 806 has its drain coupled to bit line 520, its gate coupled to node 852, and its source coupled to node 848.

In operation, when ATD circuit 522 detects a change in address, a pulse signal is provided on line 534. When the pulse signal is high, transistor 810 turns off transistor 806 to decouple flash cells 502 and 504 from bit line 520. Additionally, transistor 812 discharges node 848 towards ground. When the pulse signal is terminated and line 534 is driven to a low state, transistor 812 is turned off. If flash cells 502 and 504 are not addressed, then node 848 may be driven to a predetermined voltage of VREF minus the threshold voltages of transistors 804 and 806 (e.g., approximately 0.5 to 2 volts).

Figure 9:
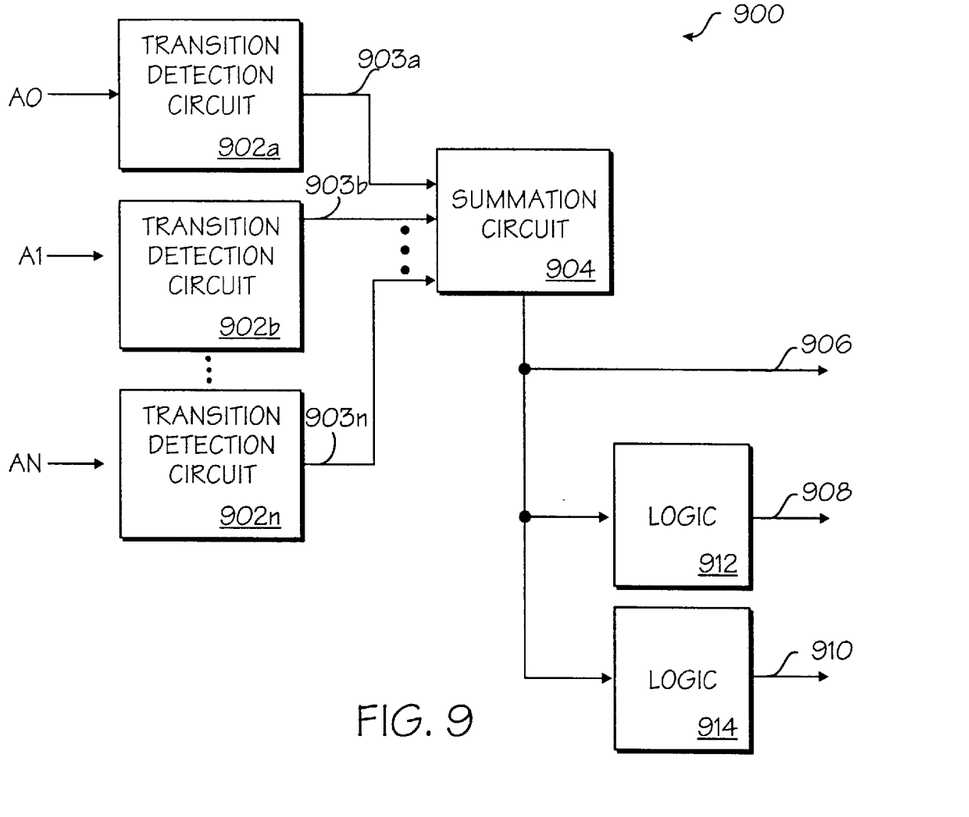
FIG. 9 is a block diagram of one embodiment of the ATD circuit of FIG. 5.

FIG. 9 shows ATD circuit 900 that is one embodiment of ATD circuit 522 of FIGS. 5 and 8. Many other embodiments of ATD circuit 522 may be used. ATD circuit 900 includes transition detection circuits 902a–902n each receiving an address inputs signal A0, A1, . . . , AN, respectively, from address bus 530. ATD circuit 900 also includes summation circuit 904, and logic blocks 912 and 914.

Figure 10:
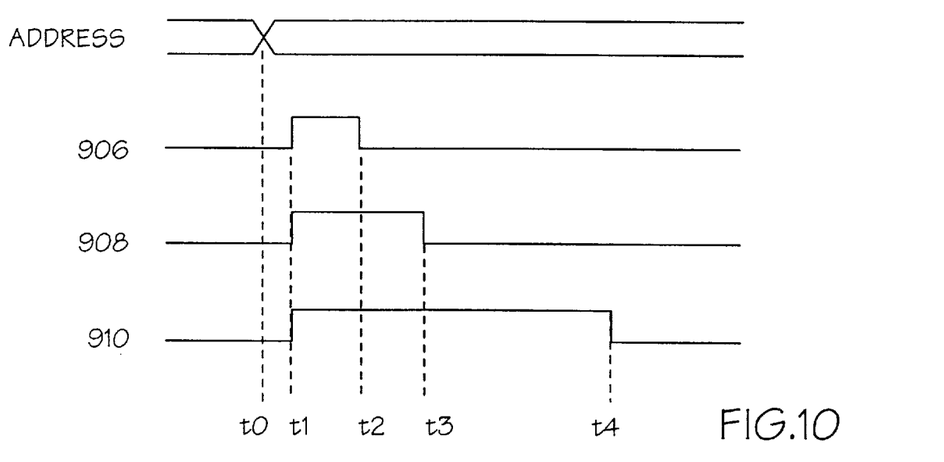
FIG. 10 is an illustrative timing diagram of the signals generated by the ATD circuit of FIG. 9.

The operation of ATD circuit 900 may be illustrated with the aid the timing diagram of FIG. 10. Transition detection circuit 902a generates a pulse signal on line 903a in response to a transition of address signal A0 at time t0. The pulse signal on line 903a is supplied to summation circuit 904 together with pulse signals generated by transition detection circuits 902b–902n on lines 903b–903n, respectively. The transition detection circuits 902a–902n may be any conventional transition detection circuit that generates a pulse signal in response to a rising and/or falling edge of an input address signal. Summation circuit 904 collects the pulse signals on lines 903a–903n and generates a pulse signal on line 906 from time t1 to time t2 if any of the transition detection circuits 902a–902n generate a pulse signal. For one embodiment, summation circuit 906 is an OR gate having its inputs coupled to lines 903a–903n, and its output coupled to line 906. The signal on line 906 may be used to indicate the start of the read access or sense operation.

In response to the pulse signal on line 906, logic 912 outputs a pulse signal on line 908. For one embodiment, the pulse signal on line 908 has a longer pulse width (i.e., to time t3) than the pulse signal on line 906. The pulse signal on line 908 may be coupled to line 534 and may be of a sufficient duration to preset or discharge node 548 (or node 848). Additionally, the pulse signal on line 908 may be of a sufficient duration to provide the appropriate A turn on time as described with respect to FIG. 7.

In response to the pulse signal on line 906, logic 914 outputs a pulse signal on line 910. For one embodiments, the pulse signal on line 914 has a longer pulse width (i.e., t0 time t4) than the pulse signals on lines 906 and 908. The pulse signal on line 910 may be of a sufficient duration to allow sense amplifier 508 to sense the voltage difference on inputs 514 and 516. For example, the falling edge of the pulse signal on line 918 can be used to latch sense amplifier 508.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A memory device comprising:
a nonvolatile memory cell;
a bit line coupled to the nonvolatile memory cell; and
circuitry coupled to the nonvolatile memory cell and the bit line, the circuitry configured to reset the bit line to a lower predetermined state for an amount of time in response to a transition of an input address signal;
wherein the circuitry comprises an address transition detection (ATD) circuit configured to receive the input address signal and generate a pulse signal; and a reset circuit coupled to the ATD circuit, the bit line, and nonvolatile memory cell, the reset circuit configured to reset the bit line to the lower predetermined state in response to the pulse signal; and
wherein the reset circuit comprises a first transistor having a first terminal coupled to the bit line, a second terminal coupled to a power supply terminal, a third terminal coupled to the ATD circuit, the first transistor driving the bit line to the lower predetermined state in response to the pulse signal, a second transistor having a first terminal coupled to the first terminal of the first transistor, a second terminal coupled to the bit line, and a third terminal coupled to the third terminal of the first transistor.

2. The memory device of claim 1, further comprising sensing circuitry coupled to the bit line and configured to sense data stored in the nonvolatile memory cell after the amount of time.

3. The memory device of claim 2, wherein the sensing circuitry comprises:
a reference nonvolatile memory cell; and
a sense amplifier having a first input coupled to the first memory cell, and a second input coupled to the reference nonvolatile memory cell.

4. The memory device of claim 1, wherein the nonvolatile memory cell stores data corresponding to one of N logic states, wherein N is greater than two.

5. The memory device of claim 1, wherein the predetermined state corresponds to approximately zero volts.

6. The memory device of claim 1, wherein the nonvolatile memory cell comprises a flash memory cell.

7. A memory device comprising:
a nonvolatile memory cell having a drain terminal;
a circuit coupled to the nonvolatile memory cell and configured to reset the drain terminal of the nonvolatile memory cell to a lower predetermined voltage for an amount of time in response to a transition of an input address signal;
a sensing circuit coupled to the drain terminal and configured to sense data stored by the nonvolatile memory cell after the amount of time; and
a bit line coupled to the drain terminal of the nonvolatile memory cell and the sense circuitry, and wherein the reset circuit further comprises a second transistor having a first terminal coupled to the drain terminal of the nonvolatile memory cell, a second terminal coupled to the bit line, and a third terminal coupled to the third terminal of a first transistor.

8. The memory device of claim 1, wherein the circuit comprises:
an address transition detection (ATD) circuit configured to receive the input address signal and generate a pulse signal;
wherein the reset circuit is coupled to the ATD circuit and the nonvolatile memory cell, and is configured to reset the drain terminal of the nonvolatile memory cell to the lower predetermined voltage in response to the pulse signal.

9. The memory device of claim 8, wherein the reset circuit comprises the first transistor having a first terminal coupled to the drain terminal of the nonvolatile memory cell, a second terminal coupled to a power supply terminal, and the third terminal coupled to the ATD circuit, the first transistor driving the drain terminal of the nonvolatile memory cell to the lower predetermined voltage in response to the pulse signal.

10. The memory device of claim 7, wherein the sensing circuitry comprises:
a reference nonvolatile memory cell; and a sense amplifier having a first input coupled to the first memory cell, and a second input coupled to the reference nonvolatile memory cell.

11. The memory device of claim 7, wherein the nonvolatile memory cell stores data corresponding to one of N logic states, wherein N is greater than two.

12. The memory device of claim 7, wherein the predetermined voltage is approximately zero volts.

13. The memory device of claim 7, wherein the nonvolatile memory cell comprises a flash memory cell.

* * * * *